United States Patent
Kobayashi et al.

(10) Patent No.: US 6,249,372 B1
(45) Date of Patent: Jun. 19, 2001

(54) FLUORESCENT CONVERSION FILTER AND COLOR DISPLAY DEVICE USING THE SAME

(75) Inventors: Ryoji Kobayashi, Kanagaowa; Toshiyuki Kanno, Nagano, both of (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/393,512

(22) Filed: Sep. 10, 1999

(30) Foreign Application Priority Data

Sep. 10, 1998 (JP) .................................................. 10-257310

(51) Int. Cl.⁷ .................................. F21V 9/08; G02B 5/20
(52) U.S. Cl. ........................ 359/326; 359/890; 362/293; 250/486.1; 250/488.1
(58) Field of Search ..................... 359/326–332, 359/885, 887, 890, 241, 242; 362/293; 250/483.1, 483.2, 483.4, 486.1, 487.1, 488.1; 313/501–504, 506, 507, 509

(56) References Cited

U.S. PATENT DOCUMENTS

| | | | |
|---|---|---|---|
| 5,586,879 | * 12/1996 | Szpak | 362/293 X |
| 5,680,188 | * 10/1997 | Yoshida et al. | 349/113 |
| 6,114,805 | * 9/2000 | Codama et al. | 313/509 |
| 6,117,529 | * 9/2000 | Leising et al. | 313/504 X |

FOREIGN PATENT DOCUMENTS

| | | |
|---|---|---|
| 861016A1 | 8/1989 | (EP) . |
| 849979A2 | 8/1998 | (EP) . |

OTHER PUBLICATIONS

UK Patent Office search report, Dec. 6, 1999.

* cited by examiner

Primary Examiner—John D. Lee
(74) Attorney, Agent, or Firm—Morrison Law Firm

(57) ABSTRACT

A fluorescent conversion filter includes a fluorescent conversion film which facilitates converting light from a wavelength region between near ultraviolet and green to light in the red region which can be finely patterned. A color display device can be produced which includes the fluorescent conversion filter. The fluorescent conversion filter includes a fluorescent conversion film and a light absorption film on the display side surface of the flourescent conversion film. The flourescent conversion film has an absorbance of 1 or less in the wavelength region between 450 nm and 520 nm. The light absorption film has an absorbance of greater than I in the wavelength region between 450 nm and 520 nm. The fluorescent conversion film contains a photo-curing resin or a photo- and thermo-setting resin, that contains an acrylate polymer, a methacrylate polymer or an acrylate-methacrylate copolymer as its main component.

24 Claims, 3 Drawing Sheets

FLUORESCENT CONVERSION FILTER AND COLOR DISPLAY DEVICE USING THE SAME

BACKGROUND OF THE INVENTION

The present invention relates to a fluorescent conversion filter used in combination with a light emitting element in a color display devices. The present invention is useful in commercial and industrial uses such as a light-emitting-type multicolor displays, a light-emitting-type full-color display, a color display panel, a monochromatic signal-light display panel and a back light. Specifically, the present invention relates to a fluorescent conversion filter that converts light in the region between near ultraviolet and green to light in the red region and facilitates its very fine patterning. More specifically, the present invention relates to a color display device that includes a fluorescent conversion filter as described above.

Research and development of various light emitting elements have been explored vigorously to meet the increasing demands for flat panel displays. Flat panel displays have become popular replacements for conventional cathode-ray-tube (CRT) displays because they save space and reduce power consumption. The electro-luminescent element (hereinafter simply referred to as a "light emitting element") is an all-solid-state self-light-emitting element that meets the above described demands. The electroluminescent element has attracted much attention due to its very high resolution and very high visibility, which other display devices do not exhibit.

To provide a flat panel display with a multicolor display function (or a full-color display function), light emitters of three primary colors (i.e. red-light emitters, blue-light emitters and green-light emitters) are separately arranged in a matrix. The light emitters in the matrix are separately controlled to emit light in each respective color (cf. Japanese Unexamined Laid Open Patent Applications No. S57-157487, No. S58-147989 and No. H03-214593). It is technically difficult and expensive to use an organic light emitting element for a color display. This is primarily due to the fact that three kinds of light emitting materials (one for each of the three primary colors) must be arranged very finely in a matrix. Each of the three light emitting elements has a different life in which the color remains pure. Since the lives of the three different light emitting materials are not identical, chromaticity deviations result over elapsed time.

The three primary colors are obtained by transmitting white light from a back light through color filters (cf. Japanese Unexamined Laid Open Patent Applications No. HOI -315988, No. H02-273496 and No. H03-194895). In order to achieve the three primary colors at high luminance it is necessary to provide a white light with a high luminance. However, it has not yet been possible to obtain an organic light emitting element which emits white light at a high luminance for a long-life.

Japanese Unexamined Laid Open Patent Application No. H03-152897 discloses a planar and separate arrangement of fluorescent materials which absorbs light from a light emitter and emits polychromatic fluorescent light. The planar and separate arrangement of fluorescent materials for emitting polychromatic fluorescent light is applicable to both CRT and plasma type displays. Japanese Unexamined Laid Open Patent Applications No. H03- 152897 and H05-258860 disclose a color conversion method that uses fluorescent materials. Flourescent materials can absorb the light emitted from an organic light emitting element and emit fluorescent light in the visible wavelength region. Since the organic light emitting element can emit colored light, the organic light emitting element which emits light at a higher luminance may be used as a light source. Japanese Unexamined Laid Open Patent Applications No. H03-152897, No. H08-286033 and H09-208944 disclose a color conversion method that uses an organic blue-light emitting element as a light source and converts the blue light to green light and red light by respective fluorescent pigments.

By finely patterning fluorescent conversion films, each including one fluorescent pigment, a full-color light-emitting type display may be constructed. The finely patterned conversion films provide a full-color display even when a weak energy ray (such as a near ultraviolet ray and a visible ray from a light emitter) is used. The fluorescent conversion filter is patterned in a similar manner as an inorganic fluorescent converter. First, a fluorescent pigment is dispersed in a liquid photo-resist (photo-reactive polymer) to form a dispersion liquid. Second, the dispersion liquid is spin coated to form a film. The formed film is patterned by photo-lithography techniques (cf Japanese Unexamined Laid Open Patent Applications No. H05-198921 and No. H05-258860). The fluorescent conversion filter is also patterned by dispersing a fluorescent pigment into a basic binder and etching the basic binder film including the fluorescent pigment with acidic aqueous solution (cf. Japanese Unexamined Laid Open Patent Application No. H09-208944).

An organic flourescent pigment is dispersed in a liquid photo-resist. The liquid phot-resist includes a photo-polymerization agent or a thermosetting agent (polymerization initiator), a reactive multi-functional monomers and a reactive multi-functional oligomers. During the photo-lithography process for patterning, bleaching of the organic pigment and extinction are often caused by the radicals and ions produced from the photo-polymerization agent or thermosetting agent (polymerization initiator), reactive multi-functional monomers and reactive multi- functional oligomers.

As described above, photo-resist is conventionally coated on a fluorescent conversion films which includes a basic binder and the photo-resist is patterned before etching with an acidic aqueous solution. This conventional method results in defects in the photo-resist which adversely affect the fluorescent conversion film. This problem has not been yet been solved.

High purity red light cannot be not obtained by a conventional flourescent conversion film which has an absorbance of less than 1. When the absorbance of the fluorescent conversion film is less than I, more than 10% of the light from the blue- or green-light emitting element is not absorbed.

Generally, adding too much fluorescent pigment to a red color filter causes self-absorption and concentration extinction. Although it is possible to achieve a highly pure red light by adding flourescent pigment, low conversion efficiency results when the pigment concentration in the red color filter is high enough to have an absorbance of greater than 1 in the wavelength region between 450 nm and 520 nm. Alternatively, the fluorescent pigment concentration can be reduced and the thickness of the color conversion filter can be increased so that an absorbance of greater than 1 may be obtained in the wavelength region between 450 nm and 520 nm. However, the thickened color conversion filter causes light leakage to the adjacent pixels, resulting in a narrowed angle of visibility.

In manufacturing color conversion type displays, the distance between the fluorescent conversion filter and the organic electro-luminescent (EL) element should be carefully adjusted. Light leaks to adjacent pixels when the distance between the fluorescent conversion filter and the organic EL element is long. Thus, a long distance between the flourescent conversion filter and the organic EL element results in a narrowed angle of visibility. Conversely, a shorter distance between the fluorescent conversion filter and the organic EL element results in a wider angle of visibility. In order to produce a wide angle of visibility, it is desirable to form an organic EL layer which is in close contact with an upper surface of a color conversion filter.

Japanese Unexamined Laid Open Patent Application No. H08-279394 discloses a conventional method for forming a transparent and electrically insulating inorganic layer directly onto fluorescent layers. Because it is difficult to flatten the color steps on the fluorescent conversion filter, undesirable concave and convex portions are found on the as-formed electrically insulating inorganic layer. As a result of this, the organic light emitting element is inevitably formed on the concave and convex portions, causing unfavorable influences which prevent very fine display performances.

The above described problem can be reduced by coating a protection layer on the fluorescent conversion filter. The protection layer flattens the surface on which the electrically insulating inorganic oxide layer is later formed. However, since the thickness of the protection layer changes with the thickness of the fluorescent conversion films, the protection layer for flattening a thick fluorescent conversion film is inevitably thick. Because of the increased thickness of the protection film, the angle of visibility of the light emitting element is narrowed.

According to manufacturing methods, the above described protection film is hardened by repeatedly heating the fluorescent conversion films. The flourescent conversion film and the protection film have different linear heat expansion coefficients. When the glass transition temperature of the fluorescent conversion film is low, the heating steps result in pattern distortions due to the difference in the linear expansion coefficients of the films. To address this problem, the protection layer materials must be carefully selected to have a low hardening temperature, harden by ultraviolet light or harden by visible light. However, even when a fluorescent conversion filter is manufactured using materials selected according to the above guideline, pattern distortions may still result. Since the glass transition temperature of the flourescent conversion film is low, the fluorescent conversion filter will have pattern distortions caused by high temperature testing.

OBJECTS AND SUMMARY OF THE INVENTION

It is an object of the present invention to provide a flourescent conversion filter which overcomes the drawbacks in the prior art.

It is another object of the present invention to provide a fluorescent conversion filter including a fluorescent conversion film that converts light in the region between near ultraviolet and green to light in the red region.

It is yet another object of the present invention to provide a fluorescent conversion filter including a fluorescent conversion film that facilitates its fine pattering.

It is still another object of the present invention to provide a fluorescent conversion filter including a fluorescent conversion film that exhibits excellent display performances.

It is a further object of the present invention to provide a display device including a fluorescent conversion filter which overcomes the drawbacks of the prior art.

It is yet a further object of the present invention to provide a flourescent conversion filter including a light absorption film with an absorbance of greater than 1 in the range between 450 nm and 520 nm.

It is still further object of the present invention to provide a flourescent conversion filter including a light absorption film on a flourescent conversion film, the light absorption film having an absorbance of greater than 1 in the wavelength range from 450 nm to 520 nm on a display panel side of the flourescent conversion film, and the flourescent conversion film having an absorbance of no more than I in the wavelength range from 450nm to 520 nm.

It is another object of the present invention to provide a flourescent conversion filter which can be finely patterned, the flourescent conversion filter including a flourescent conversion film which contains a photo-curing resin.

It is still another object of the present invention to provide a flourescent conversion filter which can be finely patterned, the flourescent conversion filter including a flourescent conversion film which contains a photo- and thermo-setting resin.

It is yet another object of the present invention to provide a flourescent conversion filter which can be finely patterned, the flourescent conversion filter including a flourescent conversion film which contains an acrylate resin.

It is another object of the present invention to provide a flourescent conversion filter which can be finely patterned, the flourescent conversion filter including a flourescent conversion film which contains an methacrylate resin.

It is still another object of the present invention to provide a flourescent conversion filter which can be finely patterned, the flourescent conversion filter including a flourescent conversion film which contains an acrylate resin and a methacrylate resin.

The foregoing problems are obviated by laminating a light absorption film, the absorbance of which is more than I in the wavelength region between 450 nm and 520 nm on the display plane side of a fluorescent conversion film, the absorbance of which is I or less in the wavelength region between 450 nm and 520 nm. A fluorescent filter that can be patterned very finely is obtained especially when the fluorescent conversion film contains a photo-curing resin or a photo- and thermo-setting resin that contains an acrylate resin and/or a methacrylate resin, and a copolymer of the acrylate polymer and the methacrylate polymer as its main components.

According to an aspect of the invention, there is provided a fluorescent conversion filter for displaying colors cooperatively with a light emitting element, the fluorescent conversion filter including: a fluorescent conversion film; and a light absorption film laminated on the fluorescent conversion film on the side of the display plane of the fluorescent conversion film; the fluorescent conversion film converting light in the region between near ultraviolet and green to light in the red region; the fluorescent conversion film facilitates its very fine patterning; the light absorbance of the fluorescent conversion film is 1 or less in the wavelength region between 450 nm and 520 nm; the light absorbance of the light absorption film is greater than 1 in the wavelength region between 450 nm and 520 nm.

According to another aspect of the invention, there is provided a fluorescent conversion filter for displaying colors cooperatively with a light emitting element, the fluorescent conversion filter including a fluorescent conversion film including a matrix resin, the matrix resin including at least one of a photo-curing resin, a photo-setting resin, and a thermo-setting resin.

According to yet another aspect of the invention, there is provided a fluorescent conversion filter for displaying colors cooperatively with a light emitting element, the fluorescent conversion filter including a fluorescent conversion film including a matrix resin, the matrix resin including at least one of a photo-curing resin, a photo-setting resin, and a thermo-setting resin. In a preferred embodiment of the invention, the photo-curing resin or the photo- and thermo-setting resin contains an acrylate polymer, a methacrylate polymer or an acrylate-methacrylate copolymer as its main component. The above described flourescent conversion filters are useful in a color display device.

Briefly stated, a fluorescent conversion filter includes a fluorescent conversion film which facilitates converting light from a wavelength region between near ultraviolet and green to light in the red region which can be finely patterned. A color display device can be produced which includes the fluorescent conversion filter. The fluorescent conversion filter includes a fluorescent conversion film and a light absorption film on the display side surface of the 5 flourescent conversion film. The flourescent conversion film has an absorbance of 1 or less in the wavelength region between 450 nm and 520 nm. The light absorption film has an absorbance of greater than 1 in the wavelength region between 450 nm and 520 nm. The fluorescent conversion film contains a photo-curing resin or a photo- and thermo-setting resin, that contains an acrylate polymer, a methacrylate polymer or an acrylate-methacrylate copolymer as its main component.

According to a feature of the invention, there is provided a fluorescent conversion filter for displaying colors cooperatively with a light emitting element, the fluorescent conversion filter comprising: a fluorescent conversion film, the 15 flourescent conversion film having a light absorbance of 1 or less in a wavelength range between 450 nm and 520nm, a light absorption film laminated on the fluorescent conversion film on a display plane side of the fluorescent conversion film, and the light absorption film having a light absorbance of more than 1 in the wavelength range between 450 nm and 520 nm.

According to another feature of the invention, there is provided a color display device comprising: a light emitting element, a fluorescent conversion, the fluorescent conversion filter including a fluorescent conversion film and a light absorption film, the flourescent conversion film having a light absorbance of 1 or less in a wavelength range between 450 nm and 520nm, the light absorption film is laminated on the fluorescent conversion film on a display plane side of the fluorescent conversion film, and the light absorption film having a light absorbance of more than 1 in the wavelength range between 450 nm and 520 nm.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

According to the present invention, red light with a high color purity may be obtained from blue- or green-light emitting elements by changing a conventional mono-layered red color filter to have an absorbance of greater than 1 in the wavelength region between 450 nm and 520 nm. In order to achieve this, the pigment concentration in the red color filter or the thickness of the red color filter should be increased so that the absorbance of the red color filter is greater than 1.

Figure 1:
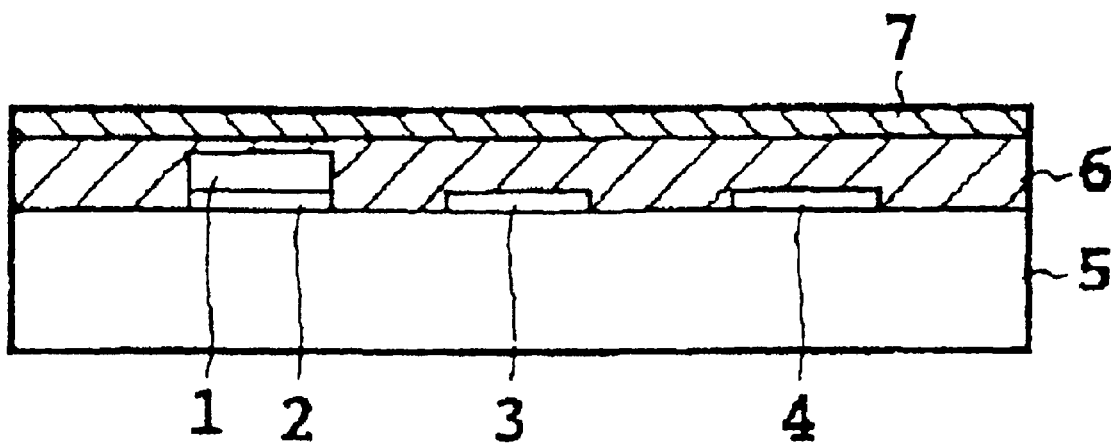
FIG. 1 is a crossection of a fluorescent conversion filter according to a first embodiment of the present invention.

As shown in FIG. 1, a fluorescent conversion filter of the present invention includes a fluorescent conversion film (1), a light absorption film (2), a green color filter (3) and a blue color filter (4) on a glass substrate (5). The glass substrate (5) works as a display plane. A protection layer (6) flattens the upper surface of the laminate. An inorganic oxide film (7) acts as an insulator on the flat upper surface of the flattened laminate (1–6). The absorbance of the fluorescent conversion film (1) is 1 or less in the wavelength region between 450 nm and 520 nm. The absorbance of the light absorption film (2) is greater than 1 in the wavelength region between 450 nm and 520 nm. The light absorption film (2) is laminated on the display plane side of the fluorescent conversion film (1).

As discussed previously, excessive light leakage occurs when the films are too thick resulting in a narrow angle of visibility. Additionally, adding excessive amounts of pigment causes self absorption and concentration extinction which results in low conversion efficiency. By providing films which have appropriate thicknesses and absorption characteristics, these problems can be avoided. The present invention includes a light absorption film (2) which is laminated on a display panel side of a flourescent conversion film (1). The differences in the absorption characteristics of the materials prevents leakage of light in the wavelength region between 450 nm and 520 nm. When these materials have an appropriate thickness (preferably less than 20 $\mu$m), a fluorescent conversion filter is realized with a wider angle of visibility and higher conversion efficiency.

The fluorescent conversion filter of the invention is applicable to both monochromatic and dichromatic signal light display devices. In such a case, either one or both of the green color filter and the blue color filter are omitted from the constituent elements.

The flourescent conversion filter of the present invention can realize very fine patterning using conventional photolithography techniques by choosing appropriate materials for the flourescent conversion film. Since conventional photolithography techniques can be used, very fine patterning is easily realized at a reduced cost. The main components of the flourescent conversion film include a photo-curing resin or a photo- and thermo-setting resin. These resins preferably contain an acrylate polymer, a methacrylate polymer or an acrylate-methacrylate copolymer. Since the glass transition temperature of a fluorescent conversion filter that employs such a fluorescent conversion film is high, the fluorescent conversion filter of the invention achieves sufficient endurance against subsequent processes and thermal resistance.

Figure 2:
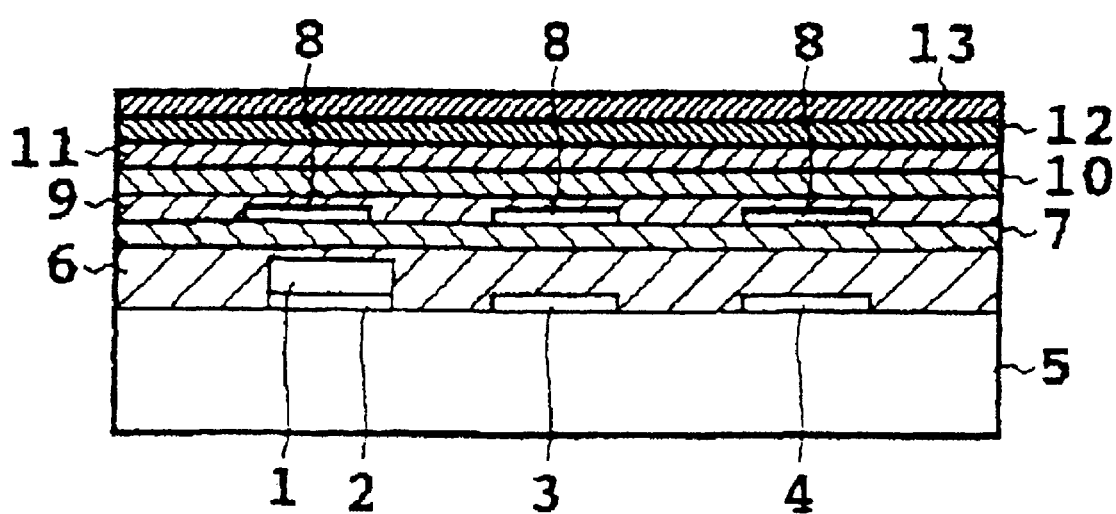
FIG. 2 is a crossection of a color display device that uses the fluorescent conversion filter of FIG. 1.

FIG. 2 shows an example of a color display device in accordance with the present invention. The color display device includes the foregoing fluorescent conversion filter combined with a light emitting element. Layers containing light emitting elements are laminated one by one on an insulating inorganic oxide film (7) of the fluorescent conversion filter which is shown in FIG. 1. More specifically, a patterned transparent electrode (8) is laminated on the insulating inorganic oxide film (7). A hole injection layer (9) is laminated on the patterned transparent electrode (8). A hole transport layer (10) is laminated on the hole injection layer (9). An organic light emitting layer (11) is laminated on the hole transport layer (10). An electron injection layer (12) is laminated on the organic light emitting layer (11). An electrode (13) is laminated on the electron injection layer (12).

Modes for carrying out the Invention

Light is generated from a light emitting element in a particular range of wavelengths. The flourescent conversion filter of the present invention employs various flourescent pigments to convert the light from the light emitting element from one wavelength range to light in another wavelength range. The fluorescent pigments used for the fluorescent conversion film of the fluorescent conversion filter are described below.

Flourescent pigments which absorb light in the blue region or in the bluish green region from a light emitting element and convert the absorbed light into light in the red region include Rhodarnine pigments such as Rhodamine B, Rhodamine 6G, Rhodamine 3B, Rhodamine 101, Rhodamine 110, Sulforhodamine, Basic violet 11 and Basic red 2, cyanine pigments such as 4-dicyanomethylene-2-methyl-6-(p-dimethylaminostyryl)-4H-pyrane (DCM), pyridine pigments such as 1-ethyl-2-[4-(p-dimethylaminophenyl)- 1, 3-butadienyl]-pyridium-perchlorate (Pyridine 1), and oxazine pigments. In addition, various dyes including direct dyes, acidic dyes, basic dyes and disperse dyes are used as far as they are fluorescent.

Fluorescent pigments which convert absorbed light in the blue region or in the bluish green region to light in a wavelength region other than red are also employable as will be described later. These fluorescent pigments include coumarin pigments such as 3-(2'-benzothiazolyl)-7-diethylaminocoumarin (Coumarin 6), 3-(2$^1$-benzoimidazolyl)-7-N,N-diethylaminocoumarin (Coumarin 7), 3-(2'-N-methylbenzoimidazolyl)-7-N,N-diethylaminocoumarin (Coumarin 30) and 2,3,5,6-1 H,4H-tetrahydro-8-trifluoromethylquinolizine(9,9a, 1-gh) coumarin (Coumarin 153), coumarin dyes such as Basic yellow 51, and naphthalimide pigments such as Solvent yellow II and Solvent yellow 116. In addition, various dyes including direct dyes, acidic dyes, basic dyes and disperse dyes are used as far as they are fluorescent.

It is preferable for the fluorescent conversion film to contain at least one fluorescent pigment or at least one fluorescent dye which emits fluorescent light in the red region. Fluorescent pigments or fluorescent dyes which emit fluorescent light in the green region may be combined with fluorescent pigments or dyes which emit fluorescent light in the red region. It is most preferred for the fluorescent conversion film to contain at least one fluorescent pigment which emits fluorescent light in the red region and at least one fluorescent pigment which emits fluorescent light in the green region.

The above described pigments which emit fluorescent light in the red or green region may be masticated previously in polymethacrylate, poly(vinyl chloride), vinyl chloride-vinyl acetate copolymer resin, alkyd resin, aromatic sulfonamide resin, urea resin, melamine resin, benzoguanamine resin and their appropriate mixture. These pigments are used either alone or in an appropriate combination.

The pigment concentrations in the fluorescent conversion film must be carefully adjusted such that concentration extinction and self-absorption are avoided. Preferably, the fluorescent conversion film has a thickness of less than 20 $\mu$m and an absorbance from 0.1 to 1 in the wavelength region between 450 nm and 520 nm. When the absorbance is less than 0.1, the fluorescent conversion film can not effectively convert emitted light from the light emitting element to red light. When the absorbance is more than 1, concentration extinction or self-absorption is caused, resulting in a low conversion efficiency.

In accordance with the present invention, the photo-curing resin or the -photo- and thermo-setting resin used in the fluorescent conversion film is a polymerization product or a crosslinking product polymerized or crosslinked through the radicals and ions produced by an optical or thermal treatment so that the resin may be insoluble and does not easily melt.

The foregoing photo-curing resin or photo- and thermo-setting resin is described in greater detail as follows:

(1) a polymerization product of acrylic multifunctional monomers and acrylic multifunctional oligomers polymerized through photo-radicals or thermo-radicals produced by an optical or thermal treatment from a composition, including the acrylic multifunctional monomers, the acrylic multifunctional oligomers and an optical or thermal polymerization initiator, (2) a crosslinking product of poly (vinyl cinnamate) crosslinked by dimerizing a composition including poly (vinyl cinnamate) and a sensitizer by an optical or thermal treatment, (3) a crosslinking product of the composition, including linear or cyclic olefin and bisazido, crosslinked with olefin through nitrene produced from a composition by an optical or thermal treatment, or (4) a polymerization product of monomers having an epoxy radical polymerized through the acid (cations) produced from a composition including the monomers and optical acid generating agent by an optical or thermal treatment.

The fluorescent conversion film that emits fluorescent light in the red region includes the foregoing fluorescent pigment, and the polymer of the foregoing photo-curing resin or the photo- and thermo-setting resin. Among the photo-curing resins or the photo- and thermo-setting resins, the polymerization product (I) of acrylic multifunctional monomers and oligomers is preferred since the polymerization product (1) can be patterned finely and exhibits high resistance to solvents and high thermal resistance. The polymerization product (1) includes a plurality of acryloyl groups or methacryloyl groups, polymerized through the photo-radicals or thermo-radicals produced from the composition, including the acrylic multifunctional monomers, the acrylic multifunctional oligomers and an optical or thermal polymerization initiator, by an optical or thermal treatment.

The light absorption film is formed on a transparent substrate by printing, dispersing, dyeing, electro-depositing or micelle-electrolysis. Various conventional pigments and dyes are used for the light absorption film.

Examples of various embodiments are described below.

First embodiment (E1)

The first embodiment of the invention will be explained below with reference to FIG. 1.

Fabrication of a light absorption film

Figure 3:
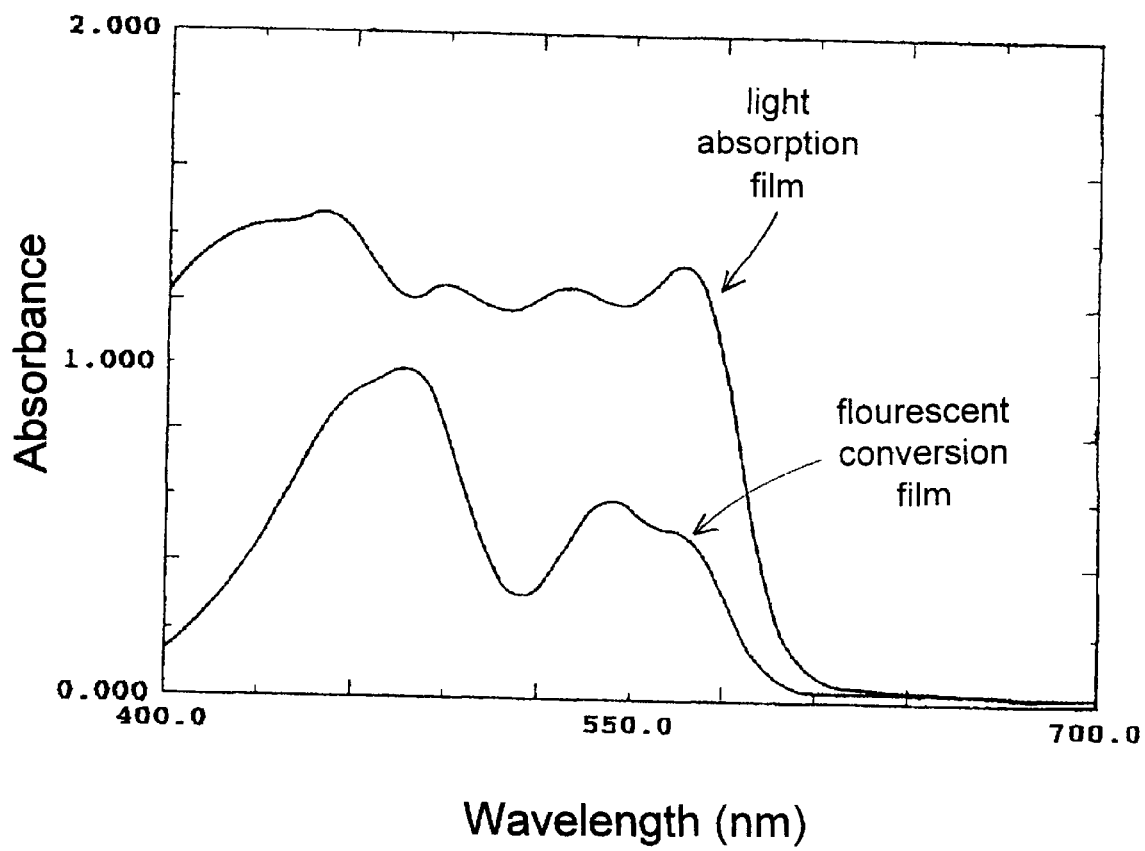
FIG. 3 is a graph showing the absorption curves of the light absorption film and the fluorescent conversion film constituting the fluorescent conversion filter according to the first embodiment of the present invention.

A red filter material is used to spin coating a glass substrate (5) which has a dimension of 143×112×1.1mm³. An example of a suitable red filter material is "Color Mosaic CR-7001" which is supplied from FUJIFILM OLIN CO., LTD. The coated red filter material layer is patterned using photolithography methods to produce a red filter layer. The resulting red filter layer (light absorption film 2) consists of stripes 1 gm thick, 0.33 mm wide and spaced apart by 1.2 mm. As shown in FIG. 3, the absorbance of the light absorption film (2) is greater than 1 in the wavelength region between 450 nm and 520 nm.

Fabrication of colored filters

A blue filter material and a green filter material are coated by spin coating a substrate (5). An example of a suitable blue filter material is "Color Mosaic CB-7001" which is supplied from FUJIFILM OLIN CO., LTD. An example of a suitable green filter material is "Color Mosaic CG-7001" which is supplied from FUJIFILM OLIN CO., LTD. The coated filter material layers are patterned using photolithography methods to produce a blue color filter (4) and a green color filter (3). Each color filter consists of stripes 1 $\mu$m thick, 0.33 mm wide, and spaced apart by 1.2 mm.

Fabrication of a fluorescent conversion film

A fluorescent conversion film (1) is formed on the above described light absorption film (2) by spin-coating a transparent photo-polymerizing resin (i.e. "SP-2600" which is supplied from Showa Highpolymer Co., Ltd.) containing Coumarin 6, Rhodamine 6G and Basic violet 11 on the light absorption film (2). The coated transparent photo-polymerizing resin is then dried in an oven. Then, the fluorescent conversion film (1) is patterned by the contact exposure technique. The contact exposure technique projects light from a high pressure mercury lamp through a mask to expose a striped pattern on the fluorescent conversion film (1). The striped pattern consist of stripes which are 0.33 mm wide and spaced apart by 1.2 mm. The exposed stripe pattern is then developed with an aqueous alkaline solution. By drying the obtained laminate in an oven, a fluorescent conversion filter of 7$\mu$m thickness is obtained. The flourescent conversion filter consists of light absorption film (2) with a 1 pm thickness, and fluorescent conversion film (1) with a 6$\mu$m thickness. As shown in FIG. 3, the pigment concentration in the fluorescent conversion film is adjusted such that the absorbance of the fluorescent conversion film (1) at the film thickness of 6$\mu$m is 1 or less, in the wavelength region between 450 nm and 520 nm.

The glass transition temperature of the fluorescent conversion filter described in the first embodiment was measured using a differential scanning calorimeter (i.e. DSC supplied from RIGAKU CORPORATION). The glass transition temperature was measured to be 112° C.

A protection layer (6) is formed on the so-far-laminated fluorescent conversion filter by spin-coating a UV-curing resin (epoxy-modified acrylate). The coated resin material is then cured by irradiated the material with light from a high pressure mercury lamp to form the protection layer. The thickness of the protection layer (6) is $^3$ $\mu$m above the fluorescent conversion film (1).

The formation of the protection layer (6) does not cause any pattern distortion in the fluorescent conversion filter and the protection layer (6) remains flat. The fluorescent conversion filter and the protection layer were tested at high temperature. Tests conducted at 100 ° C. showed no signs of distortion in the flourescent conversion filter and the protection layer. An insulating inorganic oxide film (7) is subsequently formed on the protection layer (6) by sputtering.

Fabrication of organic light emitting element

FIG. 2 shows a cross section of a color display device that uses the fluorescent conversion filter of FIG. 1. The color display device includes an organic light emitting element on an upper surface of a fluorescent conversion filter. The organic light emitting element consists of six layers: a transparent electrode as an anode (8), a hole injection layer(9), a hole transport layer (10), an organic light emitting layer (11), an electron injection layer (12) and an electrode as a cathode (13).

First, the transparent electrode (also referred to as an "ITO") is deposited on the entire upper surface of the insulating inorganic oxide film (7) of the fluorescent conversion filter. A photo-resist agent (i.e. "OFRP-800" supplied from Tokyo Ohka Kogyo Co., Ltd.) is coated on the ITO and patterned using photolithography techniques. A striped pattern of the ITO is formed consisting of stripes 0.33 mm wide, 100 nm thick, and spaced apart by 0.07 mm.

Then, the laminate, including the substrate, the fluorescent conversion filter and the transparent electrode is loaded into a resistance heating vacuum deposition chamber. In the deposition chamber a hole injection layer (9), a hole transport layer (10), an organic light emitting layer (11) and an electron injection layer (12) are deposited on the laminate one by one without breaking the vacuum.

Table 1 lists the structural formula of the materials used for the organic layers. During the film desposition, the vacuum chamber is evacuated to $1 \cdot 10^{-4}$ Pa. The hole injection layer (9) is formed by depositing a 100 nm thick layer of copper phthalocyanine (CuPc) material on the laminate. The hole transport layer (10) is then formed by depositing a 20 nm thick layer of 4,4'-bis[N-(1-naphthyl)-N-phenylamino]biphenyl ($\alpha$-NPD) material. The organic light emitting layer (11) is formed by depositing a 30 nm thick layer of 4,4'-bis(2,2'-diphenyvinyl)biphenyl (DPVBi) material. The electron injection layer (12) is formed by depositing a 20 nm thick layer of aluminum chelate (Alq) material.

The substrate, now with organic layers deposited thereon, is removed from the vacuum deposition chamber. A mask for obtaining a striped pattern, consisting of 0.33 mm wide stripes which are spaced apart by 0.07 mm, is positioned perpendicular to the ITO stripes. The substrate carrying the mask is then returned to the resistance heating vacuum deposition chamber and a 200 nm thick layer of Mg/Ag (10:1 in weight ratio) is deposited on the laminate to form electrode (13) as a cathode.

The foregoing transparent electrode (8), hole injection layer (9), hole transport layer (10), organic light emitting layer ( 1), electron injection layer (12) and electrode (13) constitute an organic light emitting element.

The color display device including the fluorescent conversion filter and the organic light emitting element is sealed with a sealant glass and a UV-curing adhesive in a dry nitrogen atmosphere in a glove box.

TABLE I

| Layers and Materials | Structural formulas |
|---|---|
| Hole injection layer 9<br>CuPc | 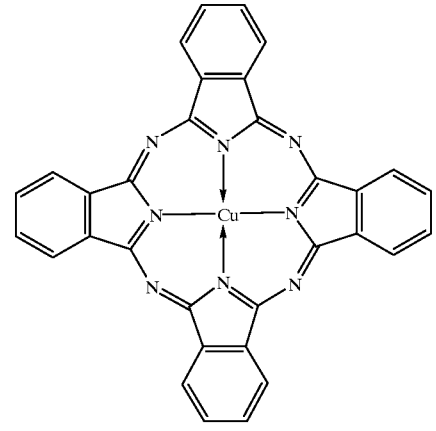 |
| Hole transport layer 10<br>α-NPD | 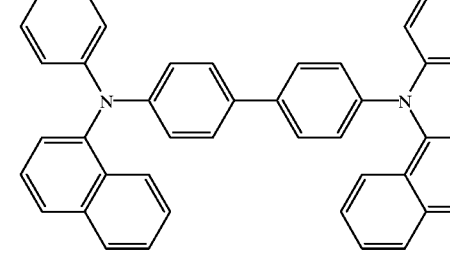 |
| Light emitting layer 11<br>DPVBi | 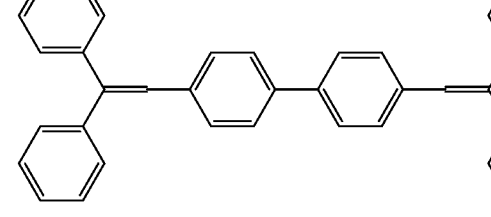 |
| Electron injection layer 12<br>Alq | 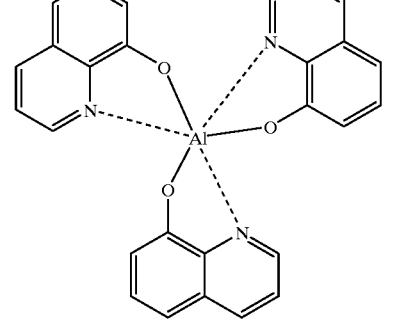 |

Second embodiment (E2)

The second embodiment of the present invention is formed in a similar manner as the first embodiment. First, a fluorescent conversion film (1) is formed on a light absorption film (2) by spin-coating a transparent photopolymerizing resin (i.e. "SP-1509" supplied from Showa Highpolymer Co., Ltd.) containing Coumarin 7, Rhodamine 6G and Basic violet I1. The coated transparent photopolymerizing resin in then dried in an oven. The fluorescent conversion film (1) is patterned with a striped pattern using the contact exposure technique which projects light from a high pressure mercury lamp through a mask to expose the fluorescent conversion film (1). The striped pattern consists of 0.33 mm wide stripes that are spaced apart by 1.2 mm. The exposed stripe pattern is developed with an aqueous alkaline solution. The obtained laminate is dried in an oven. The laminate results in a 7μm thick fluorescent conversion filter consisting of a 1 μm thick light absorption film (2) and a 6μm thick fluorescent conversion film (1). The pigment concentration in the fluorescent conversion film is adjusted such that the 6μm thick fluorescent conversion film (1) has an absorbance of 1 or less in the wavelength region between 450 nm and 520 nm.

The glass transition temperature of the fluorescent conversion filter according to the second embodiment was measured using a differential scanning calorimeter. The glass transition temperature of the second embodiment was measured as 117 ° C.

The organic light emitting element in the second embodiment is formed on the fluorescent conversion filter in the same way as in the first embodiment.

A color display device including the fluorescent conversion filter and the light emitting element is sealed in the same way as in the first embodiment.

Third embodiment (E3)

The third embodiment of the present invention is formed in a similar manner as the first embodiment. First, a fluorescent conversion film (1) is formed on a light absorption film (2) by spin-coating a transparent photo-polymerizing resin (i.e. "V-2400PET Series" which is supplied from Nippon Steel Chemical Co., Ltd.) containing Coumarin 7, Rhodamine 6G and Basic violet 11. The coated transparent photo-polymerizing resin in then dried in an oven. The fluorescent conversion film (1) is patterned with a striped pattern using the contact exposure technique which projects light from a high pressure mercury lamp through a mask to expose the fluorescent conversion film (l). The striped pattern consists of 0.33 mm wide stripes that are spaced apart by 1.2 mm. The exposed stripe pattern is developed with an aqueous alkaline solution. The obtained laminate is dried by heating the laminate in an oven The laminate results in a 7μm thick fluorescent conversion filter consisting of a 1 μm thick light absorption film (2) and a 6μm thick fluorescent conversion film (1). The pigment concentration in the fluorescent conversion film is adjusted such that the 6 μm thick fluorescent conversion film (1) has an absorbance of 1 or less in the wavelength region between 450 nm and 520 nm.

The glass transition temperature of the fluorescent conversion filter according to the third embodiment was measured using a differential scanning calorimeter. The glass transition temperature of the third embodiment was measured as 170 ° C.

The organic light emitting element in the third embodiment is formed on the fluorescent conversion filter in the same way as in the first embodiment.

A color display device including the fluorescent conversion filter and the light emitting element is sealed in the same way as in the first embodiment.

Fourth embodiment (E4)

The fourth embodiment of the present invention is formed in a similar manner as the first embodiment. First, a fluorescent conversion film (1) is formed on a light absorption film (2) by spin-coating a transparent photo-polymerizing resin (i.e. "V-2400PET Series" which is supplied from Nippon Steel Chemical Co., Ltd.) and additional transparent photo-polymerizing resin (i.e. "V-2400PET Series" which is supplied from Nippon Steel Chemical Co., Ltd.) containing Coumarin 7, Rhodamine 6G and Basic violet 11. The coated transparent photo-polymerizing resin mixture is then dried in an oven. The fluorescent conversion film (1) is patterned with a striped pattern using the contact exposure technique which projects light from a high pressure mercury lamp through a mask to expose the fluorescent conversion film (1). The striped pattern consists of 0.33 mm wide stripes that are spaced apart by 1.2 mm. The exposed stripe pattern is developed with an aqueous alkaline solution. The obtained laminate is dried by heating the laminate in an oven. The laminate results in a 7μm thick fluorescent conversion filter consisting of a 1 μm thick light absorption film (2) and a 6μm thick fluorescent conversion film (1). The pigment concentration in the fluorescent conversion film is adjusted such that the 6μm thick fluorescent conversion film (1) has an absorbance of 1 or less in the wavelength region between 450 nm and 520 nm.

The glass transition temperature of the fluorescent conversion filter according to the fourth embodiment was measured using a differential scanning calorimeter. The glass transition temperature of the fourth embodiment was measured as 220° C.

The organic light emitting element in the fourth embodiment is formed on the fluorescent conversion filter in the same way as in the first embodiment.

A color display device including the fluorescent conversion filter and the light emitting element is sealed in the same way as in the first embodiment.

Comparative example 1 (C1)

A fluorescent conversion film is formed on a glass substrate(5) which has the dimensions of 143×112×1.1 mm$^3$. A transparent photo-polymerizing resin containing Coumarin 6, Rhodamine 6G and Basic violet 11 (i.e. "SP-2600" which is supplied from Showa Higbpolymer Co., Ltd.) is spin-coated onto the glass substrate (5). The coated transparent photo-polymerizing resin in then dried in an oven. The fluorescent conversion film (1) is patterned with a striped pattern using the contact exposure technique which projects light from a high pressure mercury lamp through a mask to expose the fluorescent conversion film (1). The striped pattern consists of 0.33 mm wide stripes that are spaced apart by 1.2 mm. The exposed stripe pattern is developed with an aqueous alkaline solution. The obtained laminate is dried by heating the laminate in an oven. The laminate results in a 25 μm thick fluorescent conversion filter. The pigment concentration in the fluorescent conversion film is adjusted such that the 25 μm thick fluorescent conversion film (1) has an absorbance of more than 2 in the wavelength region between 450 nm and 520 nm.

The glass transition temperature of the fluorescent conversion filter according to comparative example 1 was measured using a differential scanning calorimeter. The glass transition temperature of comparative example 1 was measured as 140 ° C.

The organic light emitting element in comparative example 1 is formed on the fluorescent conversion filter in the same way as in the first embodiment.

A color display device including the fluorescent conversion filter and the light emitting element is sealed in the same way as in the first embodiment.

Comparative example 2 (C2)

A red filter material is used to spin coating a glass substrate (5) which has a dimension of 143×112×1.1 mm$^3$. An example of a suitable red filter material is "Color Mosaic CR-7001 " which is supplied from FUJIFILM OLIN CO., LTD. The coated red filter material layer is patterned using photolithography methods to produce a red filter layer. The resulting red filter layer (light absorption film 2) consists of stripes 0.5 µm thick, 0.33 nm wide and spaced apart by 1.2 nm. The absorbance of the light absorption film (2) is greater than 1 in the wavelength region between 450 nm and 520 nm. A blue color filter and a green color filter are formed in the same way as in the first embodiment.

A fluorescent conversion film is formed on the light absorption film (2) by spin-coating a transparent photo-polymerizing resin (i.e. "SP-2600" which is supplied from Showa Highpolymer Co., Ltd.) containing Coumarin 6, Rhodamine 6G and Basic violet 11. The coated transparent photo-polymerizing resin in then dried in an oven at 80 ° C. The fluorescent conversion film (1) is patterned with a striped pattern using the contact exposure technique which projects light from a high pressure mercury lamp through a mask to expose the fluorescent conversion film (1). The striped pattern consists of 0.33 mm wide stripes that are spaced apart by 1.2 mm. The exposed stripe pattern is developed with an aqueous alkaline solution. The obtained laminate is dried by heating the laminate in an oven. The laminate results in a 15.51 µm thick fluorescent conversion filter consisting of a 0.51 µm thick light absorption film (2) and a 15 µm thick flourescent conversion film (1). The pigment concentration in the fluorescent conversion film is adjusted such that the 15 µm thick fluorescent conversion film (1) has an absorbance of more than 1.5 in the wavelength region between 450 nm and 520 nm.

The glass transition temperature of the fluorescent conversion filter according to comparative example 2 was measured using a differential scanning calorimeter. The glass transition temperature of comparative example 2 was measured as 140 ° C.

The organic light emitting element in comparative example 2 is formed on the fluorescent conversion filter in the same way as in the first embodiment.

Comparative example 3 (C3)

A fluorescent conversion film is formed on a glass substrate (5) by spin-coating a transparent photo-polymerizing resin (i.e. "SP-2600" which is supplied from Showa Highpolymer Co., Ltd.) containing Coumarin 6, Rhodamine 6G and Basic violet 11 on the glass substrate (5). The coated transparent photo-polymerizing resin in then dried in an oven. The fluorescent conversion film (1) is patterned with a striped pattern using the contact exposure technique which projects light from a high pressure mercury lamp through a mask to expose the fluorescent conversion film (1). The striped pattern consists of 0.33 mm wide stripes that are spaced apart by 1.2 mm. The exposed stripe pattern is developed with an aqueous alkaline solution. The obtained conversion film is dried by heating the film in an oven. The film results in a 7 µm thick fluorescent conversion filter consisting of a 7 µm thick flourescent conversion film (1). The pigment concentration in the fluorescent conversion film (1) is adjusted such that the 7 µm thick fluorescent conversion film (1) has an absorbance of more than 2 in the wavelength region between 450 nm and 520 nm.

The glass transition temperature of the fluorescent conversion filter according to comparative example 3 was measured using a differential scanning calorimeter. The glass transition temperature of comparative example 3 was measured as 140 ° C.

The organic light emitting element in comparative example 3 is formed on the fluorescent conversion filter in the same way as in the first embodiment.

A color display device including the comparative fluorescent conversion filter and the light emitting element is sealed in the same way as in the first embodiment.

Comparative example 4 (C4)

A red filter material is used to spin coating a glass substrate (5) which has a dimension of 143×112×1.1 mm³. An example of a suitable red filter material is "Color Mosaic CR-7001" which is supplied from FUJIFILM OLIN CO., LTD. The coated red filter material layer is patterned using photolithography methods to produce a red filter layer. The resulting red filter layer (light absorption film 2) consists of stripes which are 0.33 mm wide and spaced apart by 1.2 mm. Then, a fluorescent conversion film is formed on the light absorption film (2) by spin-coating a transparent photo-polymerizing resin (i.e. "SR235" which is supplied from NIPPON KAYAKU CO., LTD.) containing Coumarin 7, Rhodamine 6G and Basic violet 11. The coated transparent photo-polymerizing resin in then dried in an oven. The fluorescent conversion film (1) is patterned with a striped pattern using the contact exposure technique which projects light from a high pressure mercury lamp through a mask to expose the fluorescent conversion film (1). The striped pattern consists of 0.33 mm wide stripes that are spaced apart by 1.2 mm. The exposed stripe pattern is developed with an aqueous alkaline solution. The obtained laminate is dried by heating the laminate in an oven. The laminate results in a 7 µm thick fluorescent conversion filter having a 6 µm thick flourescent conversion film (1). The absorbance of the fluorescent conversion film is such that the 6 µm thick fluorescent conversion film (1) has an absorbance of less than 1 in the wavelength region between 450 nm and 520 nm.

The glass transition temperature of the fluorescent conversion filter according to comparative example 4 was measured using a differential scanning calorimeter. The glass transition temperature of comparative example 4 was measured as 60° C.

A protection layer is formed on the so-far-laminated comparative fluorescent conversion filter in the same way as in the first embodiment. Concave and convex portions are caused on the protection layer due to the pattern distortion of the fluorescent conversion filter.

An organic light emitting element is formed on the fluorescent conversion filter in the same way as in the first embodiment.

A color display device including the fluorescent conversion filter and the light emitting element is sealed in the same way as in the first embodiment.

Evaluation of the color conversion filters according to the first through fourth embodiments and comparative examples 1 through 4

Table 2 lists the evaluation results of the color conversion filters according to the first through fourth embodiments and comparative examples 1 through 4. The evaluation items and the evaluation methods will be described later.

TABLE 2

|     | Chromaticity | | Film thickness | Angle of visibility | Luminance | Endurance against subsequent processes |
| --- | --- | --- | --- | --- | --- | --- |
|     | x | y | | | | |
| E 1 | 0.65 | 0.34 | 7 μm | Within ± 80° | 1 | ○ |
| E 2 | 0.64 | 0.33 | 7 μm | Within ± 80° | 1.04 | ○ |
| E 3 | 0.65 | 0.34 | 7 μm | Within ± 80° | 0.98 | ○ |
| E 4 | 0.65 | 0.33 | 7 μm | Within ± 80° | 1.05 | ○ |
| C 1 | 0.64 | 0.33 | 25 μm | Within ± 30° | 0.98 | ○ |
| C 2 | 0.65 | 0.34 | 15.5 μm | Within ± 50° | 1.05 | ○ |
| C 3 | 0.64 | 0.35 | 7 μm | Within ± 80° | 0.60 | ○ |
| C 4 | 0.65 | 0.35 | 7 μm | Within ± 80° | 0.89 | X |

CIE chromaticity coordinate and angle of visibility

The CIE chromaticity coordinates are measured with a photometric system (i.e. "MCPD-1000" which is supplied from Otsuka Electronics Co., Ltd.). The angles of visibility are measured at every 5 degrees of angle from 0°, defined as the angle at which the light receiving portion of the photometric system is perpendicular to the glass substrate of the specimen, to the right and left sides within the range of ±80 degrees of angle.

Film thickness

The step heights from the glass substrate surface of the light absorption film, the fluorescent conversion film and the fluorescent conversion filters including the light absorption film and the fluorescent conversion film are measured with a surface roughness meter (i.e. "DEKTAK II A" which is supplied from ULVAC JAPAN Ltd.).

Relative conversion efficiency

A reference voltage is defined as the voltage at which the luminance of the light emitted from the organic light emitting element through the fluorescent conversion filter of the first embodiment is 50 cd/M². The relative conversion efficiencies are evaluated by comparing the luminance values measured by applying the reference voltage to the organic light emitting elements on the respective fluorescent filters with 50 cd/r².

Endurance against subsequent processes

The endurance of the fluorescent conversion filters against subsequent processes are examined in terms of defects. Examples of defects include open circuits and short circuits which result when light emitting elements on the respective fluorescent conversion filters emit light.

The color display devices including a light emitting element on either one of the respective fluorescent conversion filters according to the first through fourth embodiments gave favorable performance. The resulting color display devices exhibit very fine and very practical display characteristics such as emitting red light with a high color purity, and providing a wide angle of visibility and high endurance against subsequent manufacturing processes.

The evaluation results of the fluorescent conversion filters according to the comparative examples 1 through 4 will be described below.

Since the fluorescent conversion film according to the comparative example 1 is as thick as 25 μm, the optical path between the organic light emitting element and the fluorescent conversion filter is long. The CIE chromaticity coordinate changes when the angle of visibility is outside ±30° due to the long optical path length and the red color purity is deteriorated.

Since the fluorescent conversion film according to the comparative example 2 is as thick as 15 μm due to its low absorbance, the optical path between the organic light emitting element and the fluorescent conversion filter is long. The CIE chromaticity coordinate changes when the angle of visibility is outside ±50° due to the long optical path length and the red color purity is deteriorated.

The relative luminance of the light emitted through the fluorescent conversion filter according to the comparative example 3 is 0.60 with respect to the light emitted through the fluorescent conversion filter according to the first embodiment at the same voltage applied to the respective light emitting elements. The low luminance found in comparative example 3 is attributed to the low color conversion efficiency. The low conversion efficiency is due to extinction and self absorption caused by the pigment concentration, which was adjusted such that the absorbance in the wavelength region between 450 nm and 520 nm was greater than 2 at a film thickness of 7 μm.

Comparative example 4 exhibited some scattered non-light-emitting portions and uneven light emission in the organic light emitting element on the fluorescent conversion filter. Open circuits resulted in the display device due to the concave and convex portions in the protection layer. These open circuits are very hazardous in very fine displays.

As explained above, the fluorescent conversion filter according to the invention facilitates converting the light in the wavelength region between near ultraviolet and green to the light in the red region, can be finely patterned and exhibits excellent display performances. The fluorescent conversion filter according to the invention is preferably applicable to the color display devices for civil or industrial use such as a light-emitting-type multicolor display, a light-emitting-type full-color display, a color display panel, a monochromatic signal-light display panel and a back light. The fluorescent conversion filter according to the invention facilitates manufacturing the color display devices easily with low manufacturing costs.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A fluorescent conversion filter for displaying colors cooperatively with a light emitting element, said fluorescent conversion filter comprising:
   a fluorescent conversion film;
   said flourescent conversion film having a light absorbance of 1 or less in a wavelength range between 450 nm and 520 nm;
   a light absorption film laminated on said fluorescent conversion film on a display plane side of said fluorescent conversion film; and
   said light absorption film having a light absorbance of more than 1 in said wavelength range between 450 nm and 520 nm.

2. A fluorescent conversion filter as in claim 1, wherein said fluorescent conversion film converts light in a region between near ultraviolet and green light to light in a red region.

3. A fluorescent conversion filter as in claim 1, wherein said fluorescent conversion film converts light in a region between near ultraviolet and green light to light in a red region and facilitates a very fine patterning thereof.

4. A fluorescent conversion filter as in claim 1, wherein said fluorescent conversion film includes a matrix resin.

5. A flourescent conversion filter as in claim 4, wherein said matrix resin is a photo-curing resin.

6. A flourescent conversion filter as in claim 4, wherein said matrix resin is a photo- and thermo-setting resin.

7. A flourescent conversion filter as in claim 5, wherein said photo-curing resin includes an acrylate polymer.

8. A flourescent conversion filter as in claim 5, wherein said photo-curing resin includes a methacrylate polymer.

9. A flourescent conversion filter as in claim 5, wherein said photo-curing resin includes an acrylate-methacrylate copolymer.

10. A flourescent conversion filter as in claim 6, wherein said photo- and thermo-setting resin contains an acrylate polymer.

11. A flourescent conversion filter as in claim 6, wherein said photo- and thermo-setting resin contains a methacrylate polymer.

12. A flourescent conversion filter as in claim 6, wherein said photo- and thermo-setting resin contains an acrylate-methacrylate copolymer.

13. A color display device comprising:
    a light emitting element;
    a fluorescent conversion filter;
    said fluorescent conversion filter including a fluorescent conversion film and a light absorption film;
    said flourescent conversion film having a light absorbance of 1 or less in a wavelength range between 450 nm and 520nm;
    said light absorption film is laminated on said fluorescent conversion film on a display plane side of said fluorescent conversion film; and
    said light absorption film having a light absorbance of more than 1 in said wavelength range between 450 nm and 520 nm.

14. A color display device as in claim 13, wherein said fluorescent conversion film converts light in a region between near ultraviolet and green light to light in a red region.

15. A color display device as in claim 13, wherein said fluorescent conversion film converts light in a region between near ultraviolet and green light to light in a red region and facilitates a very fine patterning thereof.

16. A color display device as in claim 13, wherein said fluorescent conversion film includes a matrix resin.

17. A color display device as in claim 16, wherein said matrix resin is a photo-curing resin.

18. A color display device as in claim 16, wherein said matrix resin is a photo- and thermo-setting resin.

19. A color display device as in claim 17, wherein said photo-curing resin includes an acrylate polymer.

20. A color display device as in claim 17, wherein said photo-curing resin includes a methacrylate polymer.

21. A color display device as in claim 17, wherein said photo-curing resin includes an acrylate-methacrylate copolymer.

22. A color display device as in claim 18, wherein said photo- and thermo-setting resin contains an acrylate polymer.

23. A color display device as in claim 18, wherein said photo- and thermo-setting resin contains a methacrylate polymer.

24. A color display device as in claim 18, wherein said photo- and thermo-setting resin contains an acrylate-methacrylate copolymer.

* * * * *